United States Patent [19]

Kashio

[11] 4,031,515

[45] June 21, 1977

[54] APPARATUS FOR TRANSMITTING CHANGEABLE LENGTH RECORDS HAVING VARIABLE LENGTH WORDS WITH INTERSPERSED RECORD AND WORD POSITIONING CODES

[75] Inventor: Toshio Kashio, Tokyo, Japan

[73] Assignee: Casio Computer Co., Ltd., Tokyo, Japan

[22] Filed: Apr. 29, 1975

[21] Appl. No.: 572,871

[30] Foreign Application Priority Data

May 1, 1974 Japan ............................. 49-48289
May 2, 1974 Japan ............................. 49-49494

[52] U.S. Cl. ..................... 364/200; 340/347 DD
[51] Int. Cl.² ..................... G06F 5/02; G06F 7/34
[58] Field of Search .............. 340/172.5, 347 DD; 235/154; 179/15.55 R, 15.55 T; 178/DIG. 3

[56] References Cited

UNITED STATES PATENTS

| | | | |
|---|---|---|---|
| 3,394,350 | 7/1968 | Packard | 340/172.5 |
| 3,535,696 | 10/1970 | Spencer et al. | 340/172.5 |
| 3,593,309 | 7/1971 | Clark et al. | 340/172.5 |
| 3,636,520 | 1/1972 | Berteau | 340/172.5 |
| 3,694,813 | 9/1972 | Loh et al. | 340/172.5 |
| 3,717,851 | 2/1973 | Cocke et al. | 340/172.5 |
| 3,750,147 | 7/1973 | Gregg | 340/347 DD |
| 3,772,654 | 11/1973 | Evans et al. | 340/172.5 |

Primary Examiner—Melvin B. Chapnick
Attorney, Agent, or Firm—Flynn & Frishauf

[57] ABSTRACT

A system for transmitting data which comprises serially arranged records of changeable length. Each record is separated from the adjacent ones by two record positioning codes and includes serially arranged words with word positioning codes interposed among them. If the same item word is included in a record and in the immediately succeeding record, the corresponding word in the succeeding record is omitted or simplified during the data transmission, thereby reducing the memory capacity of the memory for storing the data to be transmitted. Conversely, the system can restore the omitted or simplified item words to the original state and then transmit the data thus in the original state.

13 Claims, 43 Drawing Figures

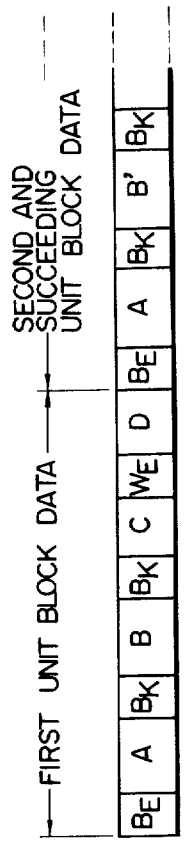
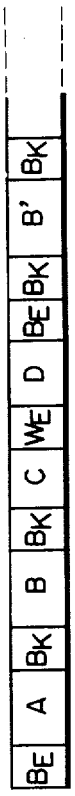
FIG. 2A
FIG. 2B
FIG. 2C
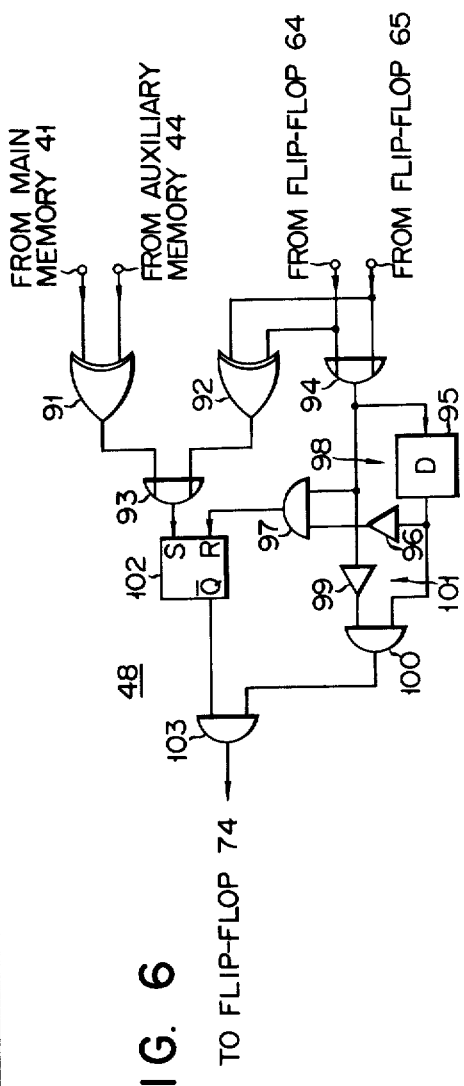
FIG. 6

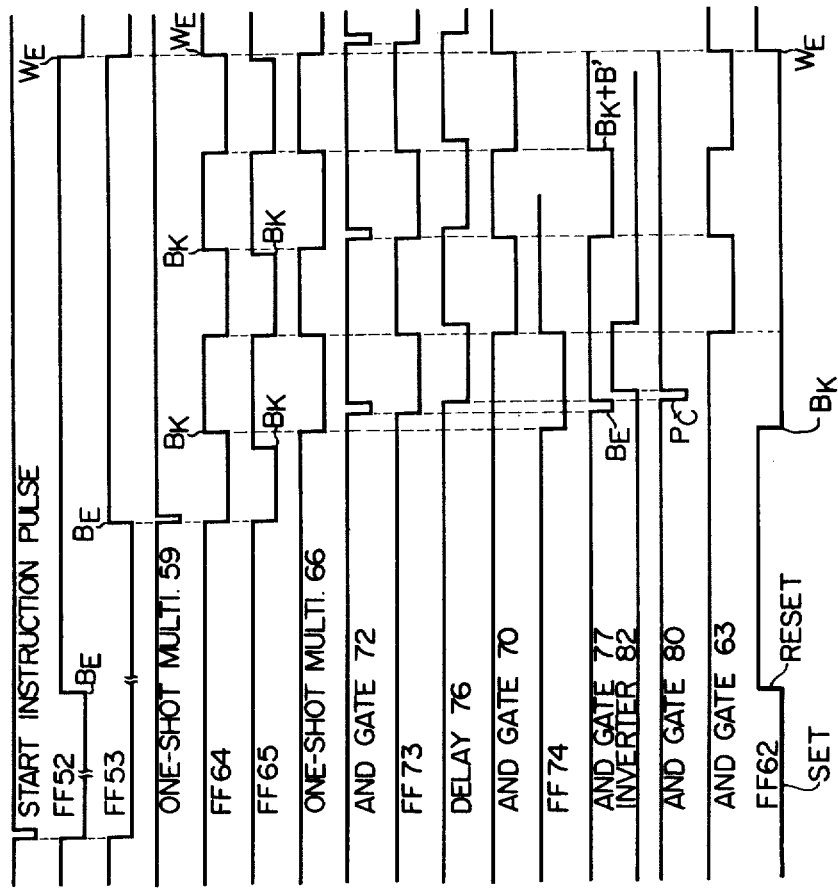

APPARATUS FOR TRANSMITTING CHANGEABLE LENGTH RECORDS HAVING VARIABLE LENGTH WORDS WITH INTERSPERSED RECORD AND WORD POSITIONING CODES

The present invention relates to a data transmitting system, and more particularly to a data transmitting system suitable for processing by an electronic computer a plurality of mutually similar unit blocks of data, each of which comprises a plurality of different word information items and at least some of the mutually corresponding word information items of which tend frequently to indicate the same content or meaning.

Such data processed by an electronic computer is exemplified by that representing a daily or monthly total amount or sales result of each commodity sold at many chain stores.

The data transmitting system of the present invention is not limited by, but for convenience will be described in respect to, the case of processing said total sales amount.

The total sales amount is generally obtained by an appropriate data processing device adapted successively to read out a plurality of mutually similar unit blocks of data signals (alternately referred to as record data signals) each formed of a plurality of different word signals respectively representing, e.g., a date, a store name, a commodity name and an amount sold and stored prior to processing by an electronic computer in such a memory device as a shaft register, core memory, magnetic drum, magnetic tape or magnetic disc having a large storage capacity and which is capable of successively reading out the signals stored herein.

At least some (in the aforesaid total sales amount, word information items designating a date, a store name and a commodity name except for an amount sold) of the mutually corresponding word information items constituting the respective unit blocks of data denoting the aforesaid total sales amount tend frequently to indicate the same meaning.

Thus, data representing the aforesaid sales results are usually stored in an electronic computer, prior to processing thereby, by totalizing for each day or month a plurality of mutually similar unit blocks of data each formed of a plurality of different word information items respectively representing a date, a store name, a commodity name and an amount sold, and are read out from the computer, where said processing is required. Accordingly, the computer is not only required to have a very large capacity, but also consumes a long time in processing the data.

It is, therefore, the object of the present invention to provide a data processing system capable of storing in a memory device in a very condensed form a plurality of mutually similar unit blocks of data, such as the aforesaid total sales amounts, each of which is formed of a plurality of different word information items and at least some of the mutually corresponding word information items of which tend frequently to indicate the same meaning, as well as capable of processing the plurality of mutually similar unit blocks of data at the highest possible speed and also with the highest possible efficiency and accuracy.

SUMMARY OF THE INVENTION

According to the present invention, a system for transmitting data in the form of a plurality of records serially arranged with record positioning codes therebetween, the records including a plurality of words serially arranged with word positioning codes interposed therebetween, comprises main memory means for temporarily storing the records serially together with the positioning codes, auxiliary memory means coupled to the main memory means for temporarily storing a record which includes words read out from the main memory means based on the positioning codes, and comparator means for comparing any one of the words of the record read out from the auxiliary memory means with the corresponding word of the record read out from the main memory means immediately after the record. Further provided is a control circuit for transmitting the record read out from the main memory means immediately after the record, in the original form, when the corresponding words are detected by the comparator means not to be identical, and for transmitting the record with the corresponding word omitted when the corresponding words are detected by said comparator to be identical.

In accordance with a further aspect of the present invention for use with the type of data described above, the system comprises main memory means for storing a series of records including one or more records each with at least one word omitted when the corresponding words of any adjacent records are identical, auxiliary memory means for temporarily storing a record including words read out from the main memory means based on the positioning codes, and detecting means for detecting that one or more words are omitted in each record read out from the main memory means. Further provided is a control means for transmitting each record read out from the main memory means in the original form when no detection output is obtained from the detecting means and for inserting, when a detection output is obtained from said detecting means, a word of the record stored in the auxiliary memory means into the next record read out from the main memory means, thereby restoring the next record to the original form so that a series of records are transmitted in the original form.

Where some of the mutually corresponding word signals constituting the respective adjacent record signals (or unit block data signals) represent the same meaning, then the system constructed as described above first stores only the foremost word signal in the original form in the memory device, but the remaining word signals in the form of a specific signal simplified from the word signal or the form free from any signal. Thereafter, the system reproduces, by the data reproducer, the specific signal or data denoting the absence of any signal back to the original form of the word signal, thereby enabling signals to be stored in the memory device in a very compact form and also any data to be processed at the highest possible speed as well as with the highest possible efficiency and accuracy.

BRIEF DSCRIPTION OF THE DRAWINGS

FIG. 2A shows a concrete array of some of a plurality of mutually similar unit blocks of data which are stored in the main memory 11 of FIG. 1;

FIGS. 2B and 2C show different data arrays where the respective unit blocks of data arranged as shown in FIG. 2A are processed by a data recording method in accordance with the invention;

Figure 5:
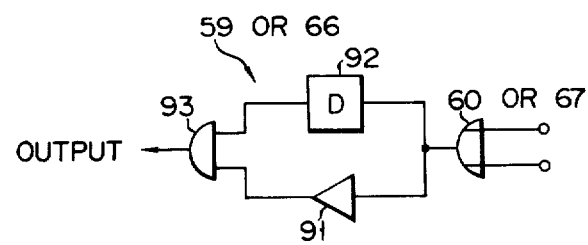
Figure 3:
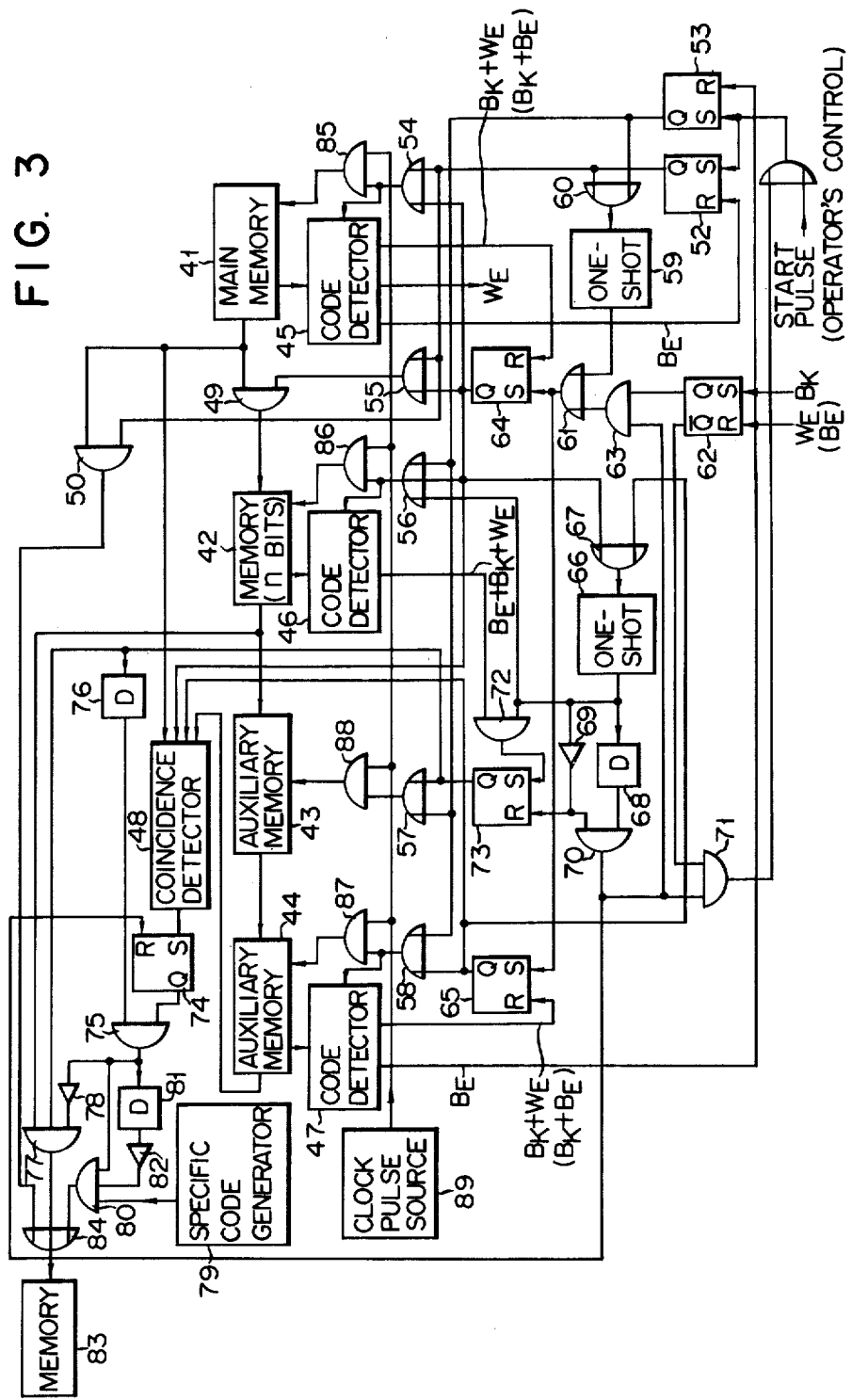
FIG. 3 shows a practical circuit arrangement of a data recording system according to one embodiment of the invention.
Figure 7:
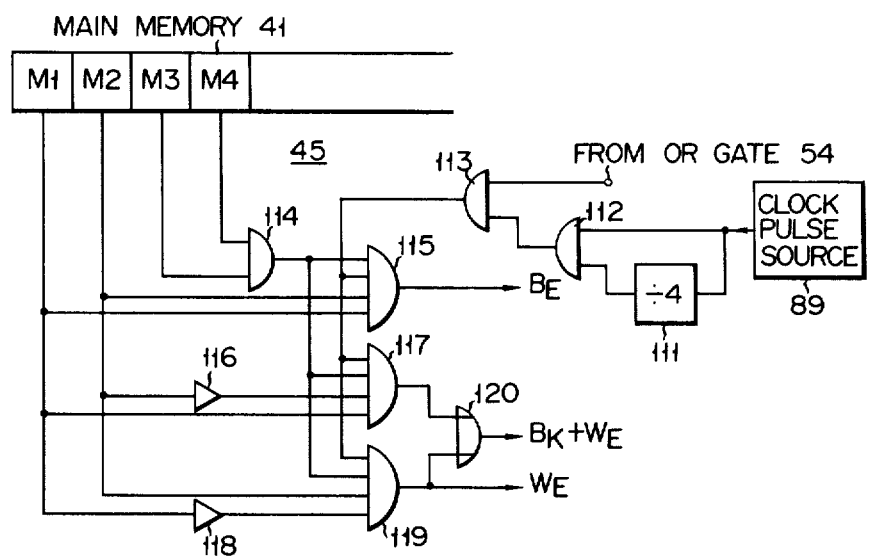
Figure 8:
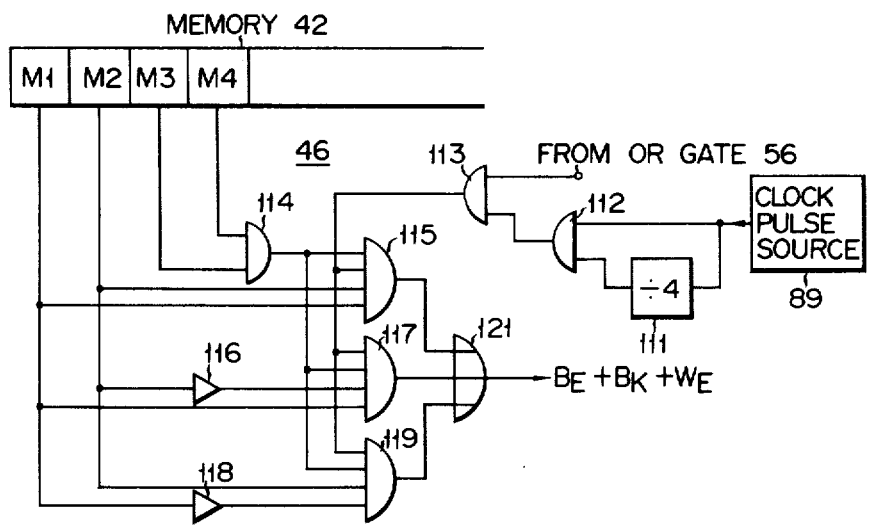
Figure 9:
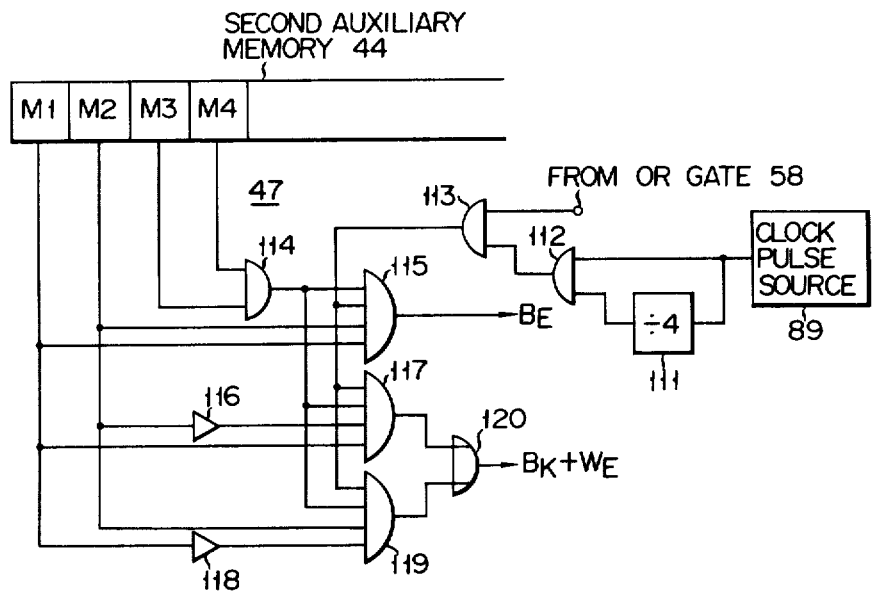
Figure 10:
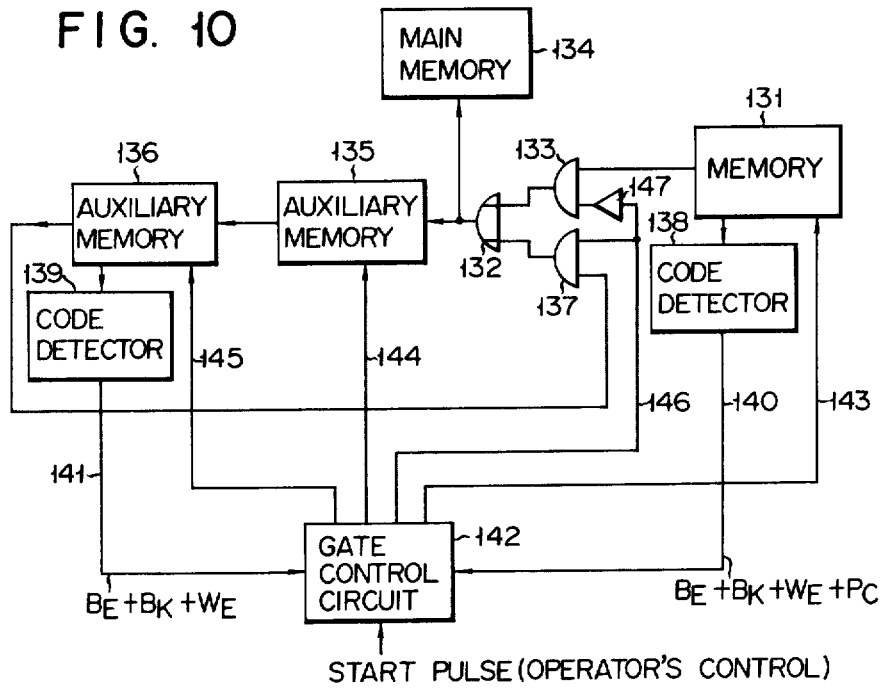
Figure 11:
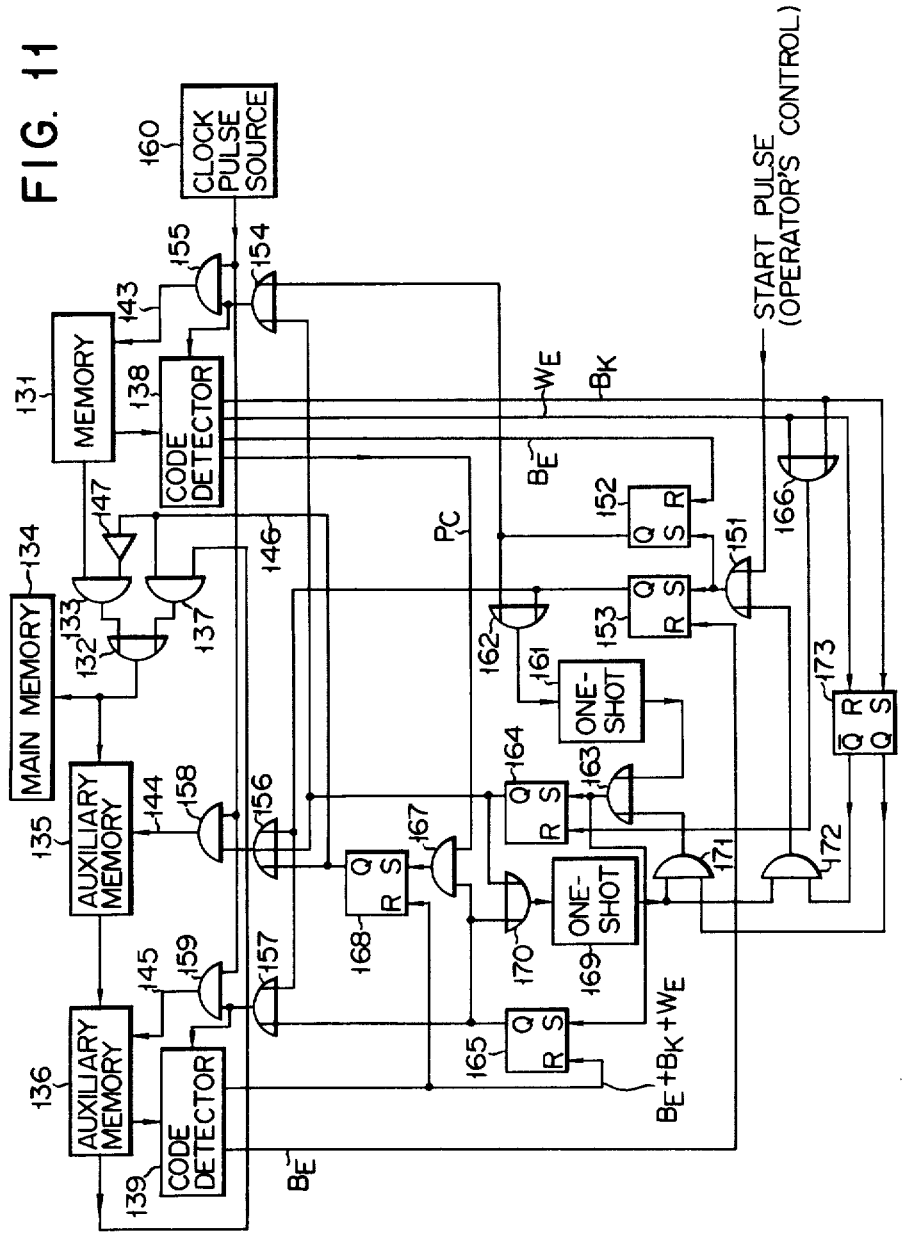
Figure 12:
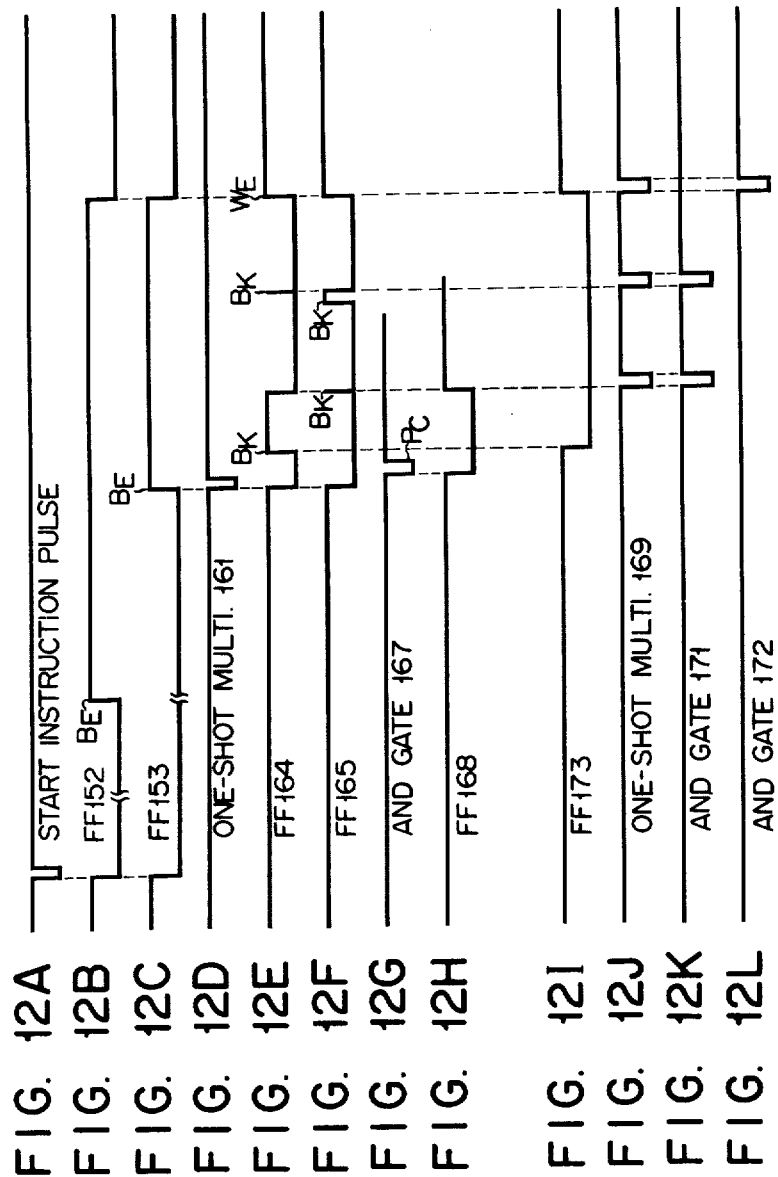
Figure 13:
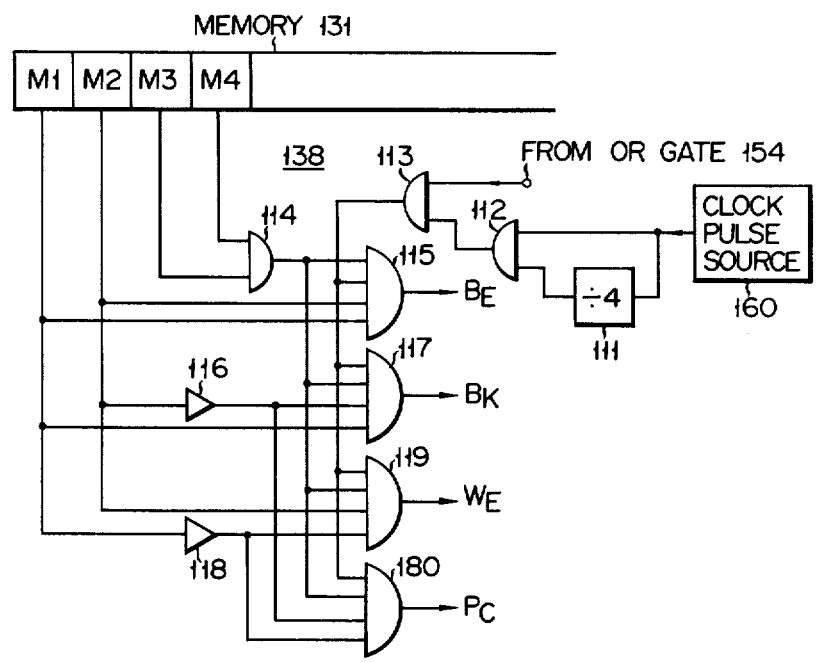
Figure 14:
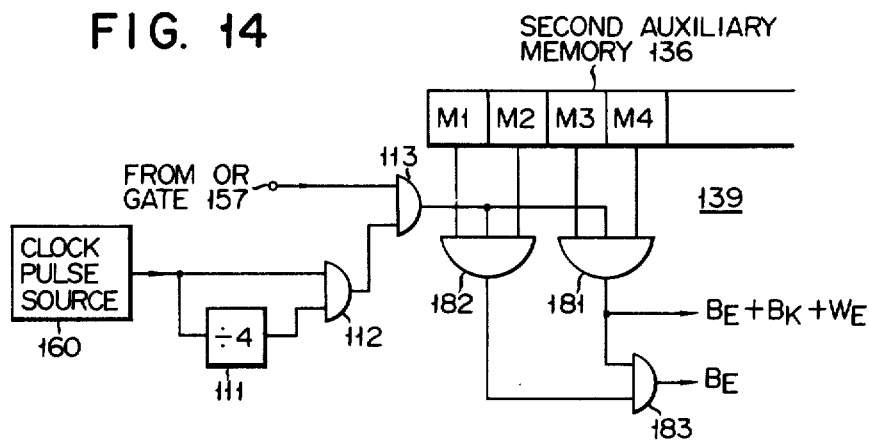

FIGS. 4A to 4Q respectively show the output waveforms of various circuit portions of FIG. 3;

FIG. 5 illustrates a practical logic circuit for each of the one-shot multivibrators 59 and 66 shown in FIG. 3;

FIG. 6 illustrates a practical logic circuit for the coincidence detector 48 shown in FIG. 3;

FIGS. 7 to 9 respectively illustrate practical logic circuits for the code detectors 45, 46 and 47 shown in FIG. 3;

FIG. 10 is a schematic block circuit diagram illustrating the principal construction of a data reproducing system in accordance with the invention;

FIG. 11 shows a practical circuit arrangement of a data reproducing system according to one embodiment of the invention;

FIGS. 12A to 12L respectively show the output waveforms of various circuit portions of FIG. 11; and FIGS. 13 and 14 respectively illustrate practical logic circuits for the code detectors 138 and 139 shown in FIG. 11.

DETAILED DESCRIPTION

Figure 1:
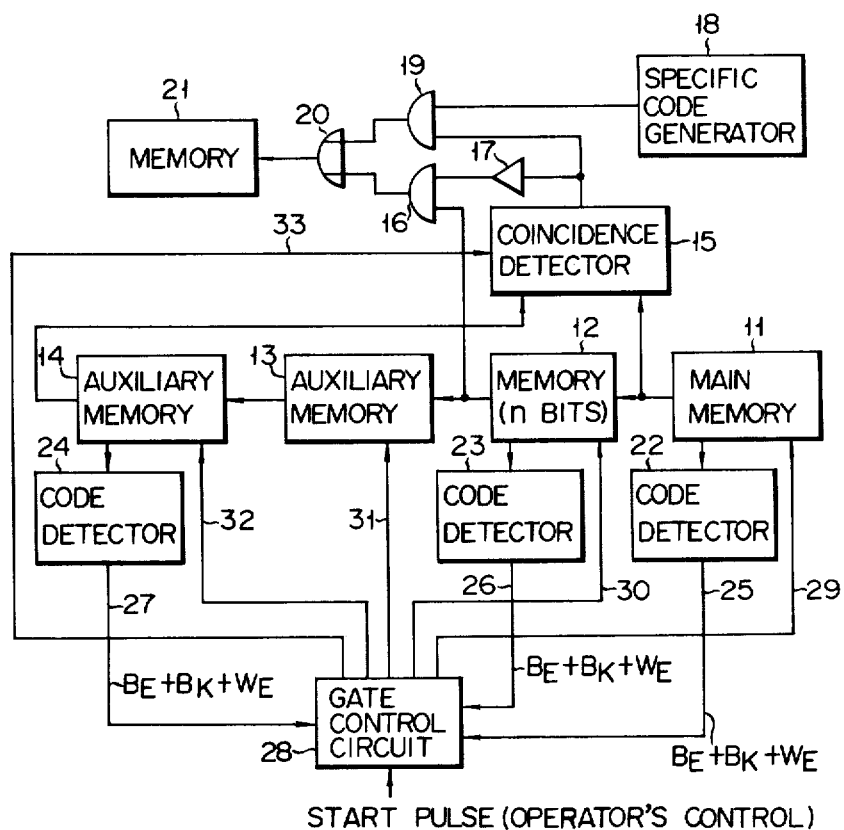
FIG. 1 is a schematic block circuit diagram illustrating the principal construction of a system in accordance with the invention.

FIG. 1 is a schematic block circuit diagram illustrating the principal construction of a transmitting and data recording system in accordance with the invention. In FIG. 1, reference numeral 11 denotes a main memory composed, e.g, of a shift register, the main memory 11 being capable of storing in series a plurality of mutually similar unit block data signals each formed of different word signals representing the above-mentioned total sales amount and successively reading out the data signals stored therein.

Let it be now assumed that the plurality of mutually similar unit block data signals stored in the main memory 11 each be composed of that representing the above-mentioned daily or monthly amount sold for any commodity at any store; among such block data, the first unit blocks of data include, as shown in FIG. 2A, a first word information item A indicating a date, a second word information item B indicating a store name, a third word information item C indicating a commodity name, and a fourth word information item D indicating an amount sold in a day or month; and among the immediately succeeding second unit block data, a first word information item be represented by A denoting the same meaning as that of the first unit block data, and a second word information item by B' indicating a different meaning from that item B of the first unit block data.

In order to enable the data signals stored in the main memory 11 to be read out for each of the respective word signals and for each of the unit block data signals, a word positioning code BK is inserted between the respective two adjacent ones of said first to fourth word information items and each of the unit block data is positioned at its both ends by block positioning codes BE.

Here, the first to third word signals respectively indicating a date, a store name and a commodity name, except for the fourth word signal indicating an amount sold, of the plurality of mutually similar unit block data signals stored in the main memory 11 tend frequently to represent the same meaning between the respective adjacent unit block data signals. Therefore, in this embodiment, some word signals of each of the unit block data signals, e.g, the first to third word signals are collectively considered as a key word signal for selectively determining through comparison between the mutually corresponding word signals included in the respective adjacent unit block data signal whether or not any of those key word signals should be transmitted after being once replaced by a specific or particular code signal Pc as later described which is more simplified in accordance with the invention than the subject word signal. Thus, a key word end code $W_E$ is inserted, in place of said word positioning code BK, between the rearmost one of the key word signals, i.e., the commodity name-indicating third word signal and the sold amount-indicating fourth or last word signal immediately succeeding the same. The sold amount-indicating fourth word signals are always transmitted in the original form thereof without being replaced by the specific code signal Pc.

As is well known in the art, the first to fourth word information items constituting each of the unit block data each are usually composed of a plurality of characters, and the respective characters are expressed by various combinations of binary coded signals of 4, 6 or 8 bits, e.g, 4 bits in accordance with the number of characters necessary to represent the whole word information items being processed. The combinations of 4-bit binary coded signals are made in a number of 16 in all as shown in Table below.

| Decimal Number | 4 bits of Binary Coded Signal Trains | | | | Usage |
|---|---|---|---|---|---|
| 0 | 0 | 0 | 0 | 0 | |
| 1 | 0 | 0 | 0 | 1 | |
| 2 | 0 | 0 | 1 | 0 | |
| 3 | 0 | 0 | 1 | 1 | For respective |
| 4 | 0 | 1 | 0 | 0 | characters for |
| 5 | 0 | 1 | 0 | 1 | constituting the |
| 6 | 0 | 1 | 1 | 0 | whole word |
| 7 | 0 | 1 | 1 | 1 | information items |
| 8 | 1 | 0 | 0 | 0 | being processed |
| 9 | 1 | 0 | 0 | 1 | |
| 10 | 1 | 0 | 1 | 0 | |
| 11 | 1 | 0 | 1 | 1 | |
| 12 | 1 | 1 | 0 | 0 | For specific code Pc |
| 13 | 1 | 1 | 0 | 1 | For word positioning code BK |
| 14 | 1 | 1 | 1 | 0 | For key word end code WE |
| 15 | 1 | 1 | 1 | 1 | For block positioning code BE |

If it is assumed that those of said 16 combinations of 4-bit binary coded signals which are necessary to represent the whole word information items being processed are sufficiently in the range of 12- the 0 0 0 0 to 1 0 1 1 listed in the above Table or less, then the remaining 1 1 1 1 , 1 1 1 0 , 1 1 0 1 and 1 1 0 0 can be used for as, e.g., the block positioning code BE, key word end code $W_E$, word positioning code BK and specific code Pc, respectively.

Thus, this embodiment is constructed as hereinunder described in order that comparison is always made between the mutually corresponding key word information items included in two adjacent ones of those plural mutually similar unit block data representing the aforesaid total sales amounts which are stored in the main memory 11, the front or preceding one of said mutually corresponding key word information items being transmitted in the original form thereof; and where said mutually corresponding key word information items are not in coincidence with each other, then the rear or succeeding key word information item is transmitted in the original form thereof in the same manner as the preceding one, whereas in case of coincidence, the coincident rear key word information item is transmitted after one replaced by said specific code signal Pc.

To the output end of the main memory 11 are cascade-connected a memory 12 having a capacity enough to store the longest one (n bits) of said first to fourth word signals constituting the respective unit block data signals, and first and second auxiliary memories 13 and 14 each having a capacity enough to store each of said unit block data signals. These memories 12 to 14 are each composed of a given memory device such as a shift register, the signal stored in which can be successively read out, similarly to the main memory 11. The output ends of the main memory 11 and second auxiliary memory 14 are connected to the corresponding input terminals of a coincidence detector 15. The output terminal of the coincidence detector 15 is connected via an inverter 17 to one input terminal of an AND gate 16, the other input terminal of which is connected to the output end of the memory 12, and also connected to one input terminal of an AND gate 19 having the other input terminal connected to the output end of a specific code generator 18 for generating the aforesaid specific code signal Pc of 4-bit binary coded signals 1 1 0 0 . The respective output terminals of the AND gates 16 and 19 are coupled via an OR gate 20 to the input terminal of a memory 21. The memory 21 is one for preserving information items being processed and comprises a semiconductor memory, a magnetic drum, a magnetic disc, a magnetic tape, a card etc. as usually called an external memory. To the output digit positions of the memories 11, 12 and 14 are respectively coupled code detectors 22, 23 and 24 for detecting the block positioning code signal BE, word positioning code signal BK and key word end code signal $W_E$ which comprise respectively the 4-bit binary coded signals 1 1 1 1 , 1 1 0 1 and 1 1 1 0 . The output lines 25, 26 and 27 of the code detectors 22 to 24 are coupled to a gate control circuit 28 triggered by a start instruction pulse signal (see FIG. 4A or 12A) produced by the operator's manipulation. When any of said code signals BE, BK and $W_E$ has been detected by any of the code detectors 22 to 24, then a gate signal for appropriately shifting the signals stored in the corresponding memories 11 to 14 is supplied from the gate control circuit 28 to the memories 11 to 14 via corresponding conductors 29 to 32 in response to the detected code signal, and also another gate signal for detecting the later described coincidence is impressed therefrom on the coincidence detector 15 via a conductor 33.

The operation of the circuitry of FIG. 1 will now be described.

Let it be now assumed that a plurality of mutually similar unit block data signals, each representing the aforesaid sales result and formed of first to fourth different word signals respectively indicating a date, a store name, a commodity name and an amount sold, be stored in the main memory 11; and no signal be stored in the memories 12 to 14.

When, under this condition, the start instruction pulse signal is impressed on the gate control circuit 28 by the operator's manipulation, then a shift or clock pulse signal is successively supplied from the gate control circuit 28 to the memories 11 to 14 via the respective conductors 29 to 32. Consequently, the signals stored in the main memory 11 are successively read out therefrom and shifted via the memories 12 and 13 into the second auxiliary memory 14. Thus, when the first unit block data signal of the signals stored in the main memory 11 is entirely read out therefrom and the block positioning code signal BE positioned at the rearmost end of the first unit block data, i.e., the foremost end of the second unit block data has been detected by the code detector 22, then the shift operation of the main memory 11 is once stopped. On the other hand, the shift operation of the memories 12 to 14 is once stopped when the block positioning code signal BE disposed at the foremost end of the first unit block data read out from the main memory 11 and shifted via the memories 12 and 13 into the second memory 14 has been detected by the code detector 24. Immediately after the block positioning code signals BE respectively positioned at the foremost ends of the second and first unit block data have been detected by the code detectors 22 and 24, the memories 11, 12 and 14 are again shift-driven under control of the clock pulse signals again supplied thereto from the gate control circuit 28 via the corresponding conductors 29, 30 and 32. As a result, comparison is made, by the coincidence detector 15, between the mutually corresponding first word signals indicating a date or dates included in the second and first unit block data signals respectively read out from the main memory 11 and the second auxiliary memory 14. At the same time, the date-indicating first word signal A of the second unit block data signal read out from the main memory 11 is successively stored in the memory 12. The foregoing comparing operation is completed or terminated at the time when the word positioning code signal BK immediately following the first word signal A of the second unit block data signal stored in the main memory 11 is detected by the code detector 22 and the word positioning code signal BK immediately succeeding the first word signal A of the first unit block data signal stored in the second auxiliary memory 14 is detected by the code detector 24.

Thereafter, a similar comparing operation is repeatedly carried out by the coincidence detector 15, for each of those first to third key word signals respectively indicating a date, a store name and a commodity name, except for the sold amount-indicating fourth word signal, which constitute each of the unit block data signals, between the mutually corresponding key word signals simultaneously read out from the main memory 11 and second auxiliary memory 14. In this case, when word coincidence is not detected by the coincidence detector 15, then the original form of the key word signal previously read out from the main memory 11 and stored in the memory 12 as mentioned above is transmitted via the AND gate 16 and the OR gate 20 into, and stored in, the memory 21. On the contrary, when the word coincidence is detected by the coincidence detector 15, then, in place of the word signal read out from the main memory 11, the specific code signal Pc, i.e, 4-bit binary coded signals 1 1 0 0 having a much more reduced number of bits than the word signal and generated by the specific code generator 18 is transmitted via and AND gate 19 and the OR gate 20 into, and stored in, the memory 21.

On the other hand, the sold amount-indicating fourth word signal D included in each of the second and succeeding unit block data signals successively read out from the main memory 11 is always transmitted in the original form thereof into, and stored in, the memory 21 without being replaced by the specific code signal Pc.

As apparent from the above, during the period in which the first unit block data signal is read out from the main memory 11, no signal is read out from the second auxiliary memory 14. Accordingly, word coincidence is not detected by the coincidence detector 15 and in consequence the first to fourth word signals A to D constituting the first unit block data signal successively read out from the main memory 11 are transmitted in the original form thereof into, and stored in, the memory 21. For this reason, only the first to third key word signals respectively indicating the date, a store name and a commodity name, except for the fourth word signal indicating an amount sold, included in each of the second and succeeding unit block data signals successively read out from the main memory 11 are practically compared by the coincidence detector 15 with the corresponding first to third key word signals included in each of the immediately preceding, i.e, first and succeeding unit block data signals successively read out from the second auxiliary memory 14.

Thus, in the case of where word coincidence is detected by the coincidence detector 15, the word signal read out from the main memory 11 is replaced by the specific code signal Pc and then stored in the memory 21; whereas in the case where word coincidence is not detected through comparison, the word signal previously shifted from the main memory 11 into the memory 12 is transmitted in the original form thereof into the memory 21, without being replaced by the specific code signal Pc as in the case of the respective fourth word signals.

Though, therefore, originally representing contents or meanings as shown in FIG. 2A, the first to fourth word information items constituting the respective unit block data stored in the main memory 11 are stored in the memory 21 with contents or meanings as shown in FIG. 2B partly converted from those of FIG. 2A.

FIG. 3 is a practical circuit arrangement of a data recording system constructed in accordance with the abovementioned principle and used for a data processing system in accordance with the invention.

In FIG. 3, reference numerals 41, 42, 43 and 44 designate memories, such as a shift register, respectively corresponding to, and having capacities and constructions equivalent to the main memory 11, memory 12, first auxiliary memory 13 and second auxiliary memory 14. To the output digit positions of these memories 41, 42 and 43 are respectively coupled code detectors 45, 46 and 47 for carrying out substantially equivalent functions to the corresponding code detectors 22, 23 and 24 of FIG. 1.

The output end of the main memory 41 is connected to an input terminal of a coincidence detector 48 for carrying out a substantially equivalent function to the coincidence detector 15 of FIG. 1 and also to each one input terminal of AND gates 49 and 50. The output terminal of the AND gate 49 is connected to the input end of the memory 42 whose output end is connected to the input end of the first auxiliary memory 43. The first auxiliary memory 43 has its output end connected to the input end of the second auxiliary memory 44 whose output end is connected to another input terminal of the coincidence detector 48.

On the other hand, a start instruction pulse signal (see FIG. 4A) generated by the operator's manipulation is applied to one input terminal of an OR gate 51.

The OR gate 51 has its output terminal connected in common to the set terminals of set-preference type bistable or R-S flip-flop circuits 52 and 53 having their reset terminals on which the block positioning code signals B comprising of 4-bit binary coded signals 1 1 1 1 and detected by the code detectors 45 and 47 are impressed. The Q output terminal of the flip-flop circuit 52 is connected to each one input terminal of OR gates 54 and 55, and to the other input terminal of the AND gate 50. The flip-flop circuit 53 has its Q output terminal connected to an input terminal of each of OR gates 56, 57 and 58. Both Q output terminals of the flip-flop circuits 52 and 53 are also connected to the corresponding input terminals of an OR gate 60 whose output terminal is connected to the input terminal of a one-shot multivibrator 59. The one-shot multivibrator 59 has its output terminal connected to one input terminal of an OR gate 61. The other input terminal of the OR gate 61 is connected to the output terminal of an AND gate 63 having one input terminal connected to the Q output terminal of an R-S flop-flop circuit 62, the flip-flop circuit 62 having its set and reset terminals to which the word positioning code signal BK and the key word end code signal $W_E$ detected by the code detector 45 are respectively applied. The output terminal of the OR gate 61 is connected in common to the respective set terminals of R-S flip-flop circuits 64 and 65, the flip-flop circuit 64 having its reset terminal on which either of the word positioning code signal BK and the key word end code signal $W_E$ detected by the code detector 45 is impressed, and the flip-flop circuit 65 having its reset terminal to which either the word positioning code signal BK or the key word end code signal $W_E$ detected by the code detector 47 is applied.

The flip-flop circuit 64 has its Q output terminal connected in common to the other input terminal of each of the OR gates 54 and 55, another input terminal of the OR gate 56, and a further input terminal of the coincidence detector 48. The OR gate 55 has its output terminal connected to the other input terminal of the AND gate 49. The flip-flop circuit 65 has its Q output terminal connected to another input terminal of the OR gate 58 and also to a still another input terminal of the coincidence detector 48. The respective Q output terminals of the flip-flop circuits 64 and 65 further connected to the corresponding input terminals of an OR gate 67 having its output terminal connected to the input terminal of a one-shot multivibrator 66. The one-shot multivibrator 66 has its output terminal connected to a further input terminal of the OR gate 56 and also to the corresponding input terminals of an AND gate 70 via a parallel circuit of an inverter 69 and a delay circuit 68 having a delay time equal to a period required for shifting any signal stored in the memory 42 from its input to its output, i.e, a period required to transmit the n-bit signals one by one. The AND gate 70 has its output terminal connected to the other input terminal of the AND gate 63, and also to one input terminal of an AND gate 71, the other input terminal of which is connected to the $\overline{Q}$ output terminal of the flip-flop circuit 62 and whose output terminal is connected to the other input terminal of the OR gate 51.

The output terminal of the one-shot multivibrator 66 is further connected to one input terminal of an AND gate 72 having the other input terminal on which either of the block positioning code signal BE and word positioning code signal WE detected by the code detector 46 is impressed.

The AND gate 72 has its output terminal connected to the set terminal of an R-S flip-flop circuit 73 whose reset terminal is connected to the output terminal of the inverter 69. The Q output terminal of the flip-flop circuit 73 is connected to another input terminal of the OR gate 57, and to one input terminal of an AND gate 75 via a delay circuit 76 having a delay time equal to a period necessary to transmit one character i.e. 4-bit signals one after another in this example, the AND gate 75 having the other input terminal connected to the Q output terminal of an R-S flip-flop circuit 74 whose set terminal is connected to the output terminal of the coincidence detector 48 and whose reset terminal is connected to the output terminal of the AND gate 70. The output terminal of the AND gate 75 is connected via an inverter 78 to an input terminal of an AND gate 77, and AND gate 77 having another input terminal connected to the output end of the memory 42 and a further input terminal connected to the Q output terminal of the flip-flop circuit 73.

The output terminal of the AND gate 75 is further connected to an input terminal of an AND gate 80 and also to another input terminal thereof via a series circuit of a delay circuit 81 having a delay time equal to that of the delay circuit 76, i.e. the period required to transmit the 4-bit signals one by one and an inverter 82, the AND gate 80 having a further input terminal connected to the output terminal of a specific code generator 79 operative to generate the specific code signal Pc consisting of 4-bit binary coded signals 1 1 0 0 . The respective output terminals of the AND gates 50, 77 and 80 are connected to the corresponding input terminals of an OR gate 84 whose output terminal is connected to the input end of a memory 83 equivalent to the memory 21 of FIG. 1.

The OR gate 54 has its output terminal connected to one input terminal of an AND gate 85 whose output erminal is connected to the shift control terminal of the main memory 41, and also to the later described gate terminal of the code detector 45. Similarly, the OR gate 56 has its output terminal connected to one input terminal of an AND gate 86 whose output terminal is connected to the shift control terminal of the memory 42, and also to the later described gate terminal of the code detector 46; and the OR gate 58 has its output terminal connected to one input terminal of an AND gate 87 whose output terminal is connected to the shift control terminal of the second auxiliary memory 44, and also to the later described gate terminal of the code detector 47.

The OR gate 57 has its output terminal connected to one input terminal of an AND gate 88, the output terminal of which is connected to the shift control terminal of the first auxiliary memory 43. The AND gates 85 to 88 have the other common input terminal connected to the output terminal of a clock pulse source 89 operative to generate the shift or clock pulses for successively reading out signals stored in the respective memories 41 to 44.

FIG. 5 indicates a practical logic circuitry of the one-shot multivibrator 59 or 66 shown in FIG. 3.

The one-shot multivibrator 59 or 66 comprises an inverter 91 having its input terminal connected to the output terminal of the corresponding OR gate 60 or 67; a delay circuit 92 having its input terminal connected to the output terminal of the corresponding OR gate 60 or 67 and a predetermined delay time; and an AND gate having two input terminals connected to the output terminals of the inverter 91 and of the delay circuit 92.

It will be apparent to those skilled in the art that the one-shot multivibrator constructed as shown in FIG. 5 so acts as to generate, from the output terminal thereof, i.e. of the AND gate 93, a pulse signal having an effective pulse duration equal to the delay time of the delay circuit 92, when an input signal applied to one or both input terminals of the OR gate 60 or 67 has been decayed.

Thus, in the embodiment, the one-shot multivibrator 59 is designed to generate a pulse signal (see FIG. 4D) having as a small effective pulse duration as possible, e.g. substantially equal to a period required to transmit a one-bit signal; and the one-shot multivibrator 66 is adapted to produce a pulse signal (see FIG. 4G) having an effective pulse duration substantially equal to a period required to shift any signal stored in the memory 42 from its input to its output, i.e. to transmit the n-bit signals one after another.

The operation of the circuitry of FIG. 3 will now be described by reference to FIGS. 4A to 4Q.

Let it be now assumed that a plurality of mutually similar unit block data signals, each formed of first to fourth different word signals respectively indicating a date, a store name, a commodity name and an amount sold which collectively represent the aforesaid sales result (see FIG. 2A), be previously stored in the main memory 41; and no signal be stored in the memories 42 to 44.

When, in this state, a start instruction pulse signal as shown in FIG. 4A is produced by the operator's manipulation, then the flip-flop circuits 52 and 53 are simultaneously set through the OR gate 51 (see FIGS. 4B and 4C), and in consequence the AND gates 49, 50 and 85 to 88 are simultaneously activated by respective Q output pulse signals delivered from the flip-flop circuits 52 and 53. Accordingly, the shift or clock pulses generated by the clock pulse source 89 are successively applied to the respective memories 41 to 44.

When the flip-flop circuits 52 and 53 are set by the start instruction pulse signal obtained through the OR gate 51, then any signal-coincidence is not detected by the coincidence detector 48, as no signal is tored in the memories 42 to 44 and consequently no signal is read out from the second auxiliary memory 44. Therefore, under this condition, signals bearing the original form are successively read out from the main memory 41 and shifted through the qualified AND gate 49 and the memories 42 and 43 into the second auxiliary memory 44 as well as shifted through the activated AND gate 50 and the OR gate 84 into the memory 83. The aforesaid shift operation of the main memory 41 is continued until the flip-flop circuit 52 is reset (see FIG. 4B) and in consequence the block positioning code signal BE positioned at the rear end of the first unit block data, i.e. at the front end of the second unit block data is detected by the code detector 45. As a result, the first unit block data signal, which is read out from the main memory 41 and includes the block positioning code signal BE positioned at the front end of the first unit block data, the first to fourth word signals A to D, the two word positioning code signals BK respectively disposed between the first and second word signals and between the second and third word signals, and the key word end code signal WE positioned between the third and fourth word signals, is stored in the original form in the memory 83 (see FIG. 2B).

On the other hand, the aforesaid shift operation of the memories 42 to 44 is continued until the flip-flop circuit 53 is reset (see FIG. 4C) and in consequence the block positioning code signal BE positioned at the front end of the first unit block data signal read out from the main memory 41 and shifted through the memories 42 and 43 into the second auxiliary memory 44 is detected by the code detector 47.

When, in this way, the flip-flop circuits 52 and 53 are both reset, then the AND gates 49, 50 and 85 to 88 are disabled once to cease the aforesaid shift operation of the respective memories 41 to 44. At the same time, the flip-flop circuits 64 and 65 are simultaneously set (see FIGS. 4E and 4F) by a pulse signal as shown in FIG. 4D derived from the one-shot multivibrator 59 (see FIG. 5). Consequently, the AND gates 49 and 85 to 88 are again activated by the respective Q output signals of the flip-flop circuits 64 and 65 to successively read out signals stored in the memories 41, 42 and 44 under control of the clock pulses delivered from the clock pulse source 89. The flip-flop circuit 64 is reset at the moment when the word positioning code signal BK disposed at the rear end of that date-indicating first cord signal A of the second unit block data signal which is tored in the main memory 41 is detected by the code detector 45. Similarly, the flip-flop circuit 65 is reset at the instance when the word positioning code signal BK positioned at the rear end of that date-indicating first word signal A of the first unit block data signal which is stored in the second auxiliary memory 44 is detected by the code detector 47.

In this way, the block positioning code signal BE positioned at the front end of the second unit block data and the immediately succeeding first word signal A read out from the main memory 41 are compared by the coincidence detector 48 with the block positioning code signal BE positioned at the front end of the first unit block data and the immediately succeeding first word signal A read out from the second auxiliary memory 44, and also shifted through the qualified AND gate 49 into the memory 42.

In this case, the first word signal A read out from the main memory 41 has the same meaning as that A read out from the second auxiliary memory 44. When, accordingly, the flip-flop circuits 64 and 65 are reset again to disable the AND gates 49 and 85 to 86, then signal-coincidence is detected by the coincidence detector 48 and in consequence the flip-flop circuit 74 is set (see FIG. 4L). When the flip-flop circuits 64 and 65 have both been reset as mentioned above, then a first pulse signal (see FIG. 4G) having an effective pulse duration equal to a period required to transmit the $n$-bit signals one by one is delivered from the one-shot multivibrator 66 and in consequence the AND gate 86 is again activated to continue the shift operation of the memory 42. When, in this way, the block positioning code signal BE disposed at the front end of the second unit block data is detected by the code detector 46, then the AND gate 72 is qualified to set the flip-flop circuit 73 (see FIG. 4I), whereby the AND gate 88 is again activated through the OR gate 57 by the Q output signal of the flip-flop circuit 73. Therefore, the memory 42 is shift-driven in synchronism with the first auxiliary memory 43 under control of the clock pulse signals derived from the clock pulse source 89.

Thus, immediately after the block positioning code signal BE disposed at the front end of that first word signal A of the second unit data signal which is stored in the memory 42 is detected by the code detector 46, said block positioning code signal BE and the immediately succeeding first word signal A are successively shifted ready for the next comparing operation into the first auxiliary memory 43.

Thus, at the decay of the first pulse signal delivered from the one-shot multivibrator 66, the AND gate 86 is disabled to stop the aforesaid shift operation of the memory 42 and, at the same time, the flip-flop circuit 73 is reset through the inverter 69 to disable the AND gate 88 and cease the aforesaid shift operation of the first auxiliary memory 43. At this time, a pulse signal delayed, by a length of time equal to a period required to transmit the $n$-bit signals one by one, from the first pulse signal derived from the one-shot multivibrator 66 is delivered from the delay circuit 68, and in consequence, the AND gate 70 is activated during a period in which the pulse signal from the delay circuit 68 is decayed, starting at the decay of the pulse signal from the one-shot multivibrator 66, thereby resetting the flip-flop circuit 74 which is set by the aforesaid coincidence signal detected by the coincidence detector 48 when the flip-flop circuits 64 and 65 are both reset as mentioned above. Accordingly, the AND gate 75 can be qualified during a period equal to the effective pulse duration of the pulse signal (see FIG. 4J) delivered from the delay circuit 76. Thus, the AND gate 77 is activated during a period (see FIG. 4M) in which the qualified pulse signal from the AND gate 75 rises, starting at the rise of the Q output from the flip-flop circuit 73. As a result, the block positioning code signal BE going ahead of that first word signal A of the second unit block data which is read out from the memory 42 is shifted through the AND gate 77 and the OR gate 84 into the memory 83, during the period in which the AND gate 77 is activated. Immediately after the AND gate 77 is disabled, the AND gate 80 is activated during a period equal to the delay time of the delay circuit 81, starting at the rise of the qualified pulse signal from the AND gate 75. As a result, the specific code signal Pc consisting of the 4-bit binary coded signals 1 1 0 0 and generated by the specific code generator 79 is shifted through the AND gate 80 and the OR gate 84 into the memory 83, During the period in which the AND gate 80 is activated.

When, in this way, the flip-flop circuit 74 is reset by the activated pulse signal from the AND gate 70, then the read-out operation to the memory 83 of the first word signal of the second unit block data immediately following the first unit block data is terminated.

Thus, at the end of the read-out operation to the memory 83 of the first word signal A included in the second unit block data, the above-mentioned pulse signal generated by the AND gate 70 is applied to the other input terminal of the AND gate 63, the AND gate 63 having one input terminal connected to the Q output terminal of the flip-flop circuit 62. At this time, the word positioning code signal BK positioned at the rear end of the first word signal A included in the second unit block data, i.e. at the front end of the store name-indicating second word signal B' included therein has been detected by the code detector 45 through the read-out operation from the main memory 41 up to the first word signal A included in the second unit block data. When, therefore, the read-out operation to the memory 83 up to the first word signal A included in the second unit block data is completed, then the AND gate 63 is activated simultaneously again to set the flip-flop circuits 64 and 65 through the OR gate 61, whereby the AND gates 49 and 85 to 87 are again qualified.

As a result, the word positioning code signal BK disposed at the rear end of the first word signal A included in the second unit block data and the immediately following store name-indicating second word signal B' successively read out from the main memory 41 are shifted through the qualified AND gate 49 into the memory 42, and also compared by the coincidence detector 48 with the word positioning code signal BK disposed at the rear end of the first word signal A included in the first unit block data and the immediately following store name-indicating second word signal B successively read out from the second auxiliary memory 44. When, in this way, the word positioning code signal BK positioned at the rear end of the second work signal B' included in the second unit block data is detected by the code detector 45 and the word positioning code signal BK disposed at the rear end of the second word signal B included in the first unit block data is detected by the code detector 47, then the flip-flop circuits 64 and 65 are again reset to disable the AND gates 49 and 85 to 87 for stopping the shift operation of the memories 41, 42 and 44 and produce a second pulse signal (see FIG. 4G) from the one-shot multivibrator 66, whereby the shift operation of the memory 42 is agin started. Thus, when the word positioning code signal BK positioned at the front end of the second word signal B' included in the second unit block data is detected by the code detector 46, then the flip-flop circuit 73 is again set to shift the word positioning code signal BK and the immediately following second word signal B' successively read out from the memory 42 into the first auxiliary memory 43, thereby preparing the next comparison operation. In this case, the second word signal B' of the second unit block data differs from that B of the first unit block data (see FIGS. 2A and 2B). Therefore, no signal coincidence is detected by the coincidence detector 48 and in consequence the flip-flop circuit 74 is not set. As a result, the AND gate 77 is qualified, only during a period in which the flip-flop circuit 73 is set, to shift the word positioning code signal BK and the immediately following second word signal B' successively read out from the memory 42 into the memory 83 through the AND gate 77 and the OR gate 84.

When, in this way, the read-out operation to the memory 83 of the word positioning code signal BK disposed at the rear end of the first word signal A included in the second unit block data and the immediately following second word signal B' is terminated, then a second pulse signal (see FIG. 4K) is delivered from the AND gate 70. At this time, the flip-flop circuit 62 is kept at its set state. Consequently, the AND gate 63 is again activated simultaneously to set the flip-flop circuits 64 and 65 through the OR gate 61, whereby the shift operation of the respective memories 41, 42 and 44 is again initiated through the corresponding qualified AND gates 85 to 87. Thus, the word positioning code signal BK disposed at the rear end of the second word signal B' of the second unit block data and the immediately following commodity name-indicating third word signal successively read out from the main memory 41 are shifted through the qualified AND gate 49 into the memory 42, and compared by the coincidence detector 48 with the word positioning code signal BK positioned at the rear end of the second word signal B of the first unit block data and the immediately following the commodity name-indicating third word signal C successively read out from the second auxiliary memory 44.

When, in this case, signal coincidence is detected by the coincidence detector 48, then, as in the case of the above-mentioned coincidence detection with respect to the first word signal A, the word positioning code signal BK disposed at the front end of the third word signal of the second unit block data read out from the memory 42 is shifted through the and gate 77 and the OR gate 84 into the memory 83, during that qualified period of the AND gate 77 which is equal to a period required for transmitting a one-character signal; and thereafter the specific code signal Pc generated by the specific code generator 79 is stored through the AND gate 80 and the OR gate 84 in the memory 83 in place of the third word signal read out from the memory 42, during that qualified period of the AND gate 80 which is equal to a period necessary to transmit a one-character signal. When, on the contrary, signal coincidence is not detected by the coincidence detector 48, then the word positioning code signal BK disposed at the front end of the third word signal of the second unit block data and the immediately following third word signal read out from the memory 42 and shifted through the AND gate 77 and the OR gate 84 into the memory 83, during that activated period of the AND gate 77 which is equal to the set period of the flip-flop circuit 73, i.e., the shift operation period of the memory 42.

When, in this way, the word positioning code signal BK disposed at the front end of the third word signal of te second unit block data and the immediately following third word signal are stored in the memory 83, then a third pulse signal (not shown in FIG. 4K) is delivered from the AND gate 70.

At this time, the key word end code signal WE consisting of the 4-bit binary coded signals 1 1 1 0 and positioned at the rear end of the third word signal of the second unit block data has been detected by the code detector 45 and in consequence the flip-flop circuit 62 has been reset concurrently with the flip-flop circuit 64. Accordingly, the AND gate 71 is qualified simultaneously to set the flip-flop circuits 52 and 53 through the OR gate 51 (see FIGS. 4B and 4C). Similarly, the key word end code signal We positioned at the rear end of the third word signal of the first unit block data has been detected by the code detector 47 and in consequence the flip-flop circuit 65 has been reset. Thus, the AND gates 49, 50 and 85 to 88 are again qualified to start the shift operation of the respective memories 41 to 44. In this case, the shift operation of the main memory 41 is continued until the flip-flop circuit 52 is again reset and in consequence the block positioning code signal BE positioned at the rear end of the sold amount-indicating fourth word signal of the second unit block data, i.e, at the front end of the third unit block data stored in the main memory 41 is detected by the code detector 45. Thus, the key word end code signal $W_E$ of the second unit block data and the immediately following fourth word signal successively read out from the main memory 41 are shifted through the activated AND gate 50 and the OR gate 84 into the memory 83 and also shifted through the qualified AND gate 49 into the memory 42. On the other hand, the aforesaid shift operation of the memories 42 to 44 is continued until the flip-flop circuit 53 is reset and in consequence the block positioning code signal BF disposed at the front end of the second unit block data, i.e, at the rear end of the sold amount-indicating fourth word signal of the first unit block data is detected by the code detector 47.

When, in this way, the flip-flop circuits 52 and 53 are again reset, then the AND gates 49, 50 and 85 to 88 are again disabled. At the same time, a second pulse signal (not shown in FIG. 4D) is delivered from the one-shot multivibrator 59, whereby the flip-flop circuits 64 and 65 are again simultaneously set, through the OR gate 61, to start the shift operation of the memories 41, 42 and 44. Accordingly, immediately after the fourth word signal of the second unit block data read out from the main memory 41 are shifted through the qualified AND gate 50 and the OR gate 84 into the memory and shifted through the qualified AND gate 49 into the memory 42, the above-mentioned pulse signal is not delivered from the one-shot multivibrator 66, whereby the flip-flop circuit 73 is not set to disable the AND gate 77. As a result, the above-mentioned coincidence detecting operating for the fourth word signal by the coincidence detector 48 is not carried out. When the flip-flop circuits 64 and 65 are reset as described above, the block positioning code signal BE disposed at the front end of the third unit block data and the immediately following first word signal successively read out from the main memory 41 are shifted through the qualified AND gate 49 into the memory 42 and also supplied to the coincidence detector 48 in synchronism with the block positioning code signal BE positioned at the front end of the second unit block data and the immediately following first word signal. successively read out from the second auxiliary memory 44. Thus, the above-mentioned operation is repeatedly carried out for each of the unit block data successively read out from the main memory 41, whereby the plurality of mutually similar unit block data, as shown in FIG. 2A which were stored in the main memory 41 are stored in the memory 83 with the form, as shown in FIG. 2B, partly converted from those of FIG. 2A. Namely, when a word signal of a unit block data read out from the main memory 41 represents the same meaning as the corresponding word signal of the immediately preceding unit block data read out from the second auxiliary memory 44, then the word signal is converted into the specific code signal Pc appreciably simplified therefrom and then stored in the memory 83, whereas the former word signal represents a different meaning from the latter word signal, then the original form of the word signal is stored in the memory 83.

FIG. 6 is a practical logic circuitry of the coincidence detector 48 shown in FIG. 3. The coincidence detector comprises a first exclusive OR gate 91 having two input terminals separately connected to the output ends of the main memory 41 and of the second auxiliary memory 44; a second exclusive OR gate 92 having two input terminals respectively connected to the Q output terminals of the flip-flop circuits 64 and 65; a first OR gate 93 having two input terminals connected to the corresponding output terminals of the first and second exclusive OR gates 91 and 92; a second OR gate 94 having two input terminals connected in common to the corresponding input terminals of the second exclusive OR gate 92; a first one-shot multivibrator 98 (see FIG. 5) comprising a delay circuit 95 having its input terminal connected to the output terminal of the second OR gate 94 and a smallest possible delay time, e.g. a delay time equal to a period required to transmit a one-bit signal, an inverter 96 having its input terminal connected to the output terminal of the delay circuit 95, and an AND gate 97 having two input terminals respectively connected to the output terminals of the inverter 96 and of the second OR gate 94; a second one-shot multivibrator 101 comprising the aforesaid delay circuit 95, an inverter 99 having its input terminal connected to the output terminal of the second OR gate 94, and an AND gate 100 having two input terminals separately connected to the output terminals of the delay circuit 95 and of the inverter 99; an R-S flip-flop circuit 102 having its set terminal connected to the output terminal of the first OR gate 93 and its reset terminal connected to the output terminal of the AND gate 97; and an AND gate 103 having two input terminals separately connected to the output terminal of the AND gate 100 and the $\bar{Q}$ output terminal of the flip-flop circuit 102.

The coincidence detector 48 constructed as shown in FIG. 6 acts as follows. Firstly, when either or both of the flip-flop circuits 64 and 65 are set, then the flip-flop circuit 102 is reset by a pulse signal derived from the first one-shot multivibrator 98. Only when, under this condition, a word signal of a unit block data read out from the main memory 41 represents the same meaning as the corresponding word signal of the immediately preceding unit block data read out from the second auxiliary memory 44, then the flip-flop circuits 64 and 65 are simultaneously reset at the decay of the disappearance of the mutually corresponding word signals supplied from the main and second auxiliary memories 41 and 44 to the coincidence detector 48, whereby a pulse signal is delivered from the second one-shot multivibrator 101 and the AND gate 103 is qualified to set the flip-flop circuit 74 of FIG. 3. Where, on the contrary, a word signal of a unit block data read out from the main memory 41 represents a different meaning from the corresponding word signal of the immediately preceding unit block data read out from the second auxiliary memory 44 or the Q output period of the flip-flop circuit 64 differs from that of the flip-flop circuit 65, then the flip-flop circuit 102 is kept at its set state and not reset, whereby the flip-flop circuit 74 is not set. Therefore, the coincidence detector 48 constructed as shown in FIG. 6 can carry out the operation as mentioned in connection with the circuitry of FIG. 3.

FIG. 7 is a practical logic circuitry of the code detector 45 shown in FIG. 3.

The code detector 45 comprises a first AND gate 112 having one input terminal connected directly to the output end of the clock pulse source 89 and the other input terminal connected via a scale-of-4 counter or ÷4 circuit 111 to the output end of the clock pulse source 89; a second AND gate 113 having one input terminal connected to the output terminal of the OR gate 54 (FIG. 3) and the other input terminal connected to the output terminal of the first AND gate 112; a third AND gate 114 having two input terminals separately connected to the output terminals of the third and fourth ones M3 and M4 of the output side 4 memory positions M1 to M4 of the main memory 41; a fourth AND gate 115 having four input terminals respectively connected to the output terminals of the second AND gate 113, of the third AND gate 114, of the second memory position M2 and of the first memory position M1; a fifth AND gate 117 having four input terminals separately connected to the output terminals of the second AND gate 113, of the third AND gate 114, of the second memory position M2 via an inverter 116 and of the first memory position M1; a sixth AND gate 119 having four input terminals respectively connected to the output terminals of the second AND gate 112, of the third AND gate 114, of the second memory position M2 and of the first memory position M1 via an inverter 118; and an OR gate 120 having two input terminals connected to the corresponding output terminals of the fifth and sixth AND gates 117 and 119.

Assuming that the output side 4 memory positions M1 to M4 of the main memory 41 have the binary decimal significances of $2^0$, $2^1$, $2^2$ and $2^3$ in turn, then the code detector 45 constructed as shown in FIG. 7 functions as follows each time four clock pulses are generated by the clock pulse source 89 only during a period in which an output signal is delivered from the OR gate 54.

When the signals stored in the memory positions M1 to M4 of the main memory 41 correspond to the binary coded signals 1 1 1 1 , then the AND gate 115 is activated to produce the block positioning code signal $B_E$; indicate 1 1 0 1 , then the AND gate 117 is qualified to deliver the word positioning code signal $B_K$; and represent 1 1 1 0 , then the AND gate 119 is qualified to produce the key word end code signal $W_E$, causing the OR gate 120 to produce either of the word positioning code signal $B_K$ and the key word end code signal $W_E$.

FIG. 8 shows a practical logic circuitry of the code detector 46 of FIG. 3.

The code detector of FIG. 8 has the same construction as that of FIG. 7, excepting that the output terminal of the OR gate 56 of FIG. 3 is connected to the one input terminal of the second AND gate 113 in place of that of the OR gate 54; and an OR gate 121, in place of the OR gate 120 of FIG. 7, having three input terminals separately connected to the output terminals of the AND gates 115, 117 and 119 is provided for producing either of the block positioning code signal $B_E$, word positioning code signal $B_K$ and key word end code signal $W_E$, and in consequence parts of FIG. 8 corresponding to those of FIG. 7 are denoted by the same reference numerals and the description thereof is omitted.

FIG. 9 is a practical logic circuitry of the code detector 47 shown in FIG. 3.

The code detector of FIG. 9 has substantially the same construction as that of FIG. 7, excepting that the output terminal of the OR gate 58 of FIG. 3 is connected to the one input terminal of the second AND gate 113 in place of that of the OR gate 54, and consequently, parts of FIG. 9 corresponding to those of FIG. 7 are designated by the same symbols and the description thereof is omitted.

FIG. 10 is a schematic block circuit diagram illustrating a principal construction of a data reproducing system in accordance with the invention used in combination with a data recording system shown in FIG. 1 or 3.

In FIG. 10, reference numberal 131 denotes a memory corresponding to the memory 21 of FIG. 1 or the memory 83 of FIG. 3. Accordingly, a plurality of mutually similar unit block data, bearing the original form as shown in FIG. 2A, each formed of those first to fourth different word information items which collectively represent a daily or monthly amount sold for a commodity at a store are stored in the memory 131 with the form, as shown in FIG. 2B, partly converted from those of FIG. 2A.

In order to reproduce the plurality of mutually similar unit block data stored in the memory 131 with the form, as shown in FIG. 2B, partly converted from those of FIG. 2A back to the original form of the plurality of mutually similar unit block data as shown in FIG. 2A, the principal circuitry of FIG. 10 is constructed as follows.

The output end of the memory 131 is connected to one input terminal of an AND gate 133 having its output terminal connected to one input terminal of an OR gate 132. The output terminal of the OR gate 132 is connected to the input end of a main memory 134 equivalent to that 11 or 41 of FIG. 1 or 3. To the output terminal of the OR gate 132 are further cascade-connected first and second auxiliary memories 135 and 136, such as shift register, having substantially equivalent construction and capacity (i.e. a sufficient capacity to store each of the respective unit block data signals) to the first and second auxiliary memories 43 and 44. The output end of the second auxiliary memory 136 is connected to one input terminal of an AND gate 137, the AND gate 137 having its output terminal connected to the other input terminal of the OR gate 132. To the output digit position of the memory 131 is coupled a code detector 138 for detecting either of the block positioning code signal $B_E$, word positioning code signal $B_K$, key word end code signal $W_E$ and specific code signal Pc of the plurality of mutually similar unit block data signals stored in the memory 131. Similarly, to the output digit position of the second auxiliary memory 136 is coupled a code detector 139 for detecting either of the block positioning code signal $B_E$, word positioning code signal $B_K$ and key word end code signal $W_E$ read out from the second auxiliary memory 136 as later described. The respective output lines 140 and 141 of the code detectors 138 and 139 are coupled to a gate control circuit 142 acting in a manner similar to the gate control circuit 28 of FIG. 1 and being supplied with a start instruction pulse signal (see FIG. 12A) generated by the operator's manipulation; and, when any of said code signals is detected by any of the code detectors 138 and 139, then a gate signal for appropriately shifting signals stored in the corresponding memories 131 and 136 is supplied from the gate control circuit 142 to the memories 131, 135 and 136 via corresponding conductors 143, 144 and 145 in response to the detected code signal, and also another gate signal for selectively activating the AND gates 133 and 137 is impressed via a conductor 146 from the gate control circuit 142 on the other output terminal of the AND gate 133 via an inverter 147 and also directly on the other output terminal of the AND gate 137.

The operation of the circuitry of FIG. 10 constructed as mentioned aboe will now be schematically described.

Let it be now assumed that such a plurality of similar original unit block data as shown in FIG. 2A are stored in the memory 131 in a state converted into such forms as shown in FIG. 2B; and no signal is stored in the first and second auxiliary memories 135 and 136. When, under this condition, such a start instruction pulse signal as shown in FIG. 12A is applied by the operator to the gate control circuit 142, shift or clock pulse signals are successively supplied from the gate control circuit 142 to the memories 131, 135 and 136 through the corresponding conductors 143 to 145, respectively. In this case, since no signal is read out from the memory 136, the AND gate 133 is qualified, so that the data signal in the memory 131 is successively supplied to the main memory 134 through the qualified AND gate 133 and the OR gate 132 and is sequentially shifted to the second auxiliary memory 136 through the first auxiliary memory 135. Thus, when all of the first unit block data signals stored in the memory 131 are read out and the block positioning code signal $B_E$ situated at the rear end of said first unit block data has been detected by the code detector 138, the shift operation of the memory 131 is once stopped.

On the other hand, when the block positioning code signal $B_E$ situated at the front end of the first unit block data read from the memory 131 into the second auxiliary memory 136 through the qualified AND gate 133, the OR gate 132 and the first auxiliary memory 135 has been detected by the code detector 139, the shift operations of the memories 135 and 136 are once stopped. In this way, when the block positioning code signal $B_F$ situated at the front end of the second unit block data is detected by the code detector 138 and yet the block positioning code signal $B_E$ situated at the front end of the first unit block data is detected by the code detector 139, the shift operations of the memories 131, 135 and 136 are again started under the control of the clock pulse signals supplied from the gate control circuit 142 through the corresponding conductors 143 to 145. Thus, the block positioning code signal $B_E$ disposed at the front end of the second unit block data is read from the memory 131 and supplied to the main memory 134 through the AND gate 133 and the OR gate 132 as well as simultaneously shifted into the first auxiliary memory 135.

When, in this way, the block positioning code signal $B_F$ positioned at the front end of the second unit block data is read out from the memory 131 and yet the block positioning code signal $B_E$ disposed at the front end of the first unit block data is read out from the second auxiliary memory 136, then the specific code signal Pc is detected by the code detector 138 (see FIG. 2B) and also the date-representing first word signal A of the first unit block data is set at a state wherein it is capable of being read out. For this reason, where the specific code signal Pc has been detected by the code detector 138, the AND gate 137 is qualified with the result that, in replacement of the specific code signal Pc read out from the memory 131, the corresponding date-indicating first word signal stored in the memory 136 and included in the immediately preceding first unit block is supplied to the main memory 134 through the qualified AND gate 137 and the OR gate 132, and also shifted into the first auxiliary memory 135 and subsequently shifted into the second auxiliary memory 136. Unless, on the other hand, the specific code signal Pc is detected by the code detector 138, the respective word signals read out from the memory 131 are supplied to the main memory 134 and shifted into the first auxiliary memory 135 and subsequently shifted into the second auxiliary memory 136. Where, through detecting as such with respect to each word signal whether or not the specific code signal Pc is stored in the memory 131, the specific code signal Pc has been detected by the code detector 138, in replacement of the specific code signal Pc read out from the memory 131 the "One unit block"-preceding word signal read out from the second auxiliary memory 136 is supplied to the main memory 134. Conversely, where, through such detection, the specific code signal is not detected by the code detector 138, the respective word signals read out from the memory 131 are supplied to the main memory 134. At the same time, the word signal supplied to the main memory 134, in replacement of the word signal read out from the second auxiliary memory 136, is stored in the memory 136 through the first auxiliary memory 135.

The above-mentioned detecting operation for the specific code signal Pc is carried out solely with respect to the key word signals including the first to third word signals in each unit block data. Therefore, where the key word end code signal $W_E$ situated at the rear end of the last key word signal in each unit block data is detected by the code detector 138, then the word signal read in succession to the last key word signal from the memory 131 is always supplied to the main memory 134 in the original form.

According to the circuit of FIG. 10, that word signal of the word signals stored in the memory 131 which is stored in a state replaced with the specific code signal Pc can be also supplied to the main memory 134 after returned to the original word signal.

FIG. 11 shows a practical circuit arrangement of a data reproducing system constructed in accordance with the aforesaid principle of this invention.

Parts of FIG. 11 corresponding to those of FIG. 10 are denoted by the same reference numerals, and the description thereof is omitted. That start instruction pulse signal as shown in FIG. 12A which is generated through the operator's manipulation is supplied to one input terminal of an OR gate 151. The output terminal of the OR gate 151 is connected to the respective set terminals of set-preference type R-S flip-flop circuits 152 and 153 having reset terminals supplied with the above-mentioned block positioning code signal $B_F$ composed of four binary coded signals 1 1 1 1 and detected by the code detectors 138 and 139. The Q output terminal of the flip-flop circuit 152 is connected to one input terminal of an OR gate 154. The output terminal of the OR gate 154 is connected to one input terminal of an AND gate 155 whose output terminal is connected to the shift control terminal 143 of the memory 131. The Q output terminal of the flip-flop circuit 153 is connected to one input terminal of an OR gate 156 and also to one input terminal of an OR gate 157. The output terminal of the OR gate 156 is connected to one input terminal of an AND gate 158 whose output terminal is connected to the shift control terminal 144 of the first auxiliary memory 135. The output terminal of the OR gate 157 is connected to one input terminal of an AND gate 159 whose output terminal is connected to the shift control terminal 145 of the second auxiliary memory 136. The AND gates 155, 158 and 159 have the other common input terminal connected to the outut terminal of a clock pulse source 160. The Q output terminals of the flip-flop circuits 152 and 153 are connected to the corresponding input terminals of an OR gate 162, the output terminal of which is connected to the input terminal of a one-shot multivibrator 161 for generating a pulse signal with a smallest possible effective pulse duration equal to a period required to transmit, e.g. a one-bit signal. The output terminal of the one-shot multivibrator 161 is connected to one input terminal of an OR gate 163. The output terminal of the OR gate 163 is connected to each set terminal of R-S flip-flop circuits 164 and 165. The flip-flop circuit 164 has its reset terminal connected to the output terminal of an OR gate 166 having two input terminals to which either of the word positioning code signal BK and key word end code signal WE consisting of 4-bit binary coded signals 1 1 0 1 and 1 1 1 0, respectively, which are detected by the code detector 138 is applied. The flip-flop circuit 165 has its reset terminal to which either the block positioning code signal BE, word positioning code signal BE, or word positioning code signal $W_E$ is applied. The flip-flop circuit 164 has its Q output terminal connected to the input terminal of the OR gate 156. The flip-flop circuit 165 has its Q output terminal connected to the other input terminal of the OR gate 157 and also to the other input terminal of an AND gate 167, the AND gate 167 having one input terminal on which the specific code signal Pc consisting of 4-bit binary coded signals 1 1 0 0, and detected by the code detector 138 is impressed. The output terminal of the AND gate 167 is connected to the set terminal of an R-S flip-flop circuit 168 having its reset terminal connected to the reset terminal of the flip-flop circuit 165. The flip-flop circuit 168 has its Q output terminal connected to a further input terminal of the OR gate 156 and to the conductor 146. The Q output terminals of the flip-flop circuits 164 and 165 are connected to the respective input terminals of an OR gate 170, the output terminal of which is connected to the input terminal of a one-shot multivibrator 169 for generating a pulse signal with an effective pulse duration substantially equal to a period required to transmit a one-bit signal as in the one-shot multivibrator 161. The output terminal of the one-shot multivibrator 169 is connected to one input terminal of an AND gate 171 with its output terminal connected to the other input terminal of the OR gate 163, and also to one input terminal of an AND gate 172 with its output terminal connected to the other input terminal of the OR gate 151. The other input terminal of the AND gate 171 is connected to the Q output terminal of an R-S flip-flop circuit 173 having its set terminal adapted to receive the word positioning code signal BK from the code detector 138 and its reset terminal to which the key word end code signal $W_E$ is supplied therefrom. The other input terminal of the AND gate 172 is connected to the $\overline{Q}$ output terminal of the flip-flop circuit 173.

FIG. 13 is a practical logic circuitry of the code detector 131 coupled to the output digit section of the memory 131 shown in FIG. 10 or 11. The code detector 138 is similar in construction to the code detector 45 of FIG. 7, except for the omission of the OR gate 120 in FIG. 7 and for the addition of an AND gate 180 for generating, in receipt of the respective output signals of the AND gates 113 and 114 and inverters 116 and 118, the specific code signal Pc consisting of 4-bit binary coded signals 1 1 0 0. Therefore, any further explanation is omitted.

FIG. 14 shows a practical logic circuitry of the code detector 139 coupled to the output digit section of the second auxiliary memory 136.

The code detector 139 comprises an AND gate 181 having two input terminals connected to the output terminal of the third and fourth ones M3 and M4 of the output side 4 memory positions M1 to M4 in the second auxiliary memory 136, and the other input terminal connected to the output terminal of the AND gate 113 in FIG. 7; an AND gate 182 having two input terminals connected to the first and second memory positions M1 and M2 of the second auxiliary memory device 136 and the other input terminal connected to the output terminal of the AND gate 113; and an AND gate 183 with two input terminals connected to the respective output terminals of the AND gates 181 and 182. With the code detector 139 of this type, it will be evident that it is possible to generate from the output terminal of the AND gate 181 the above-mentioned block positioning code signal BE, word positioning code signal BK and key word end code signal $W_E$ constituting 4-bit binary coded signals 1 1 1 1, 1 1 0 1 and 1 1 1 0, respectively, and from the output terminal of the AND gate 183 the block positioning code signal The operation of the circuit of FIG. 11 will be explained by reference to FIGS. 12A to 12L.

Suppose that a plurality of mutually similar original unit block data as shown in FIG. 2A are stored in a form converted to the configuration as shown in FIG. 2B and that no signal is stored in the first and second auxiliary memories 135 and 136. When, in this state, a start instruction pulse signal as shown in FIG. 12A is generated through the operator's manipulation, then the flip-flop circuits 152 and 153 are simultaneously set through the OR gate 151 (see FIGS. 12B and 12C) and the AND gate 155 is qualified by the Q output signal of the flip-flop circuit 152 to cause the memory 131 to be shift-controlled. At the same time, and AND gates 158 and 159 are qualified to cause the first and second auxiliary memories 135 and 136 to be shift controlled. Since, at the start of shifting of the second auxiliary memory 136 no signal is read out therefrom, the AND gate 137 is disabled. At the start of shifting of the memory 131, the specific code signal Pc is not detected by the code detector 138 and the flip-flop circuit 168 is not set. For this reason, the AND gate 133 is qualified. As a result, signals sequentially read out from the memory 131 are supplied through the OR gate 132 to the main memory 134 and also shifted through the first auxiliary memory 135 into the second auxiliary memory 136. The shifting in the memory 131 is interrupted at the time the flip-flop circuit 152 is reset i.e. at the time the block positioning code signal BE located at the front end of the second unit block data is detected by the code detector 138 after the first unit block data are all read out from the memory 131 and supplied to the main memory 134. The above-mentioned shifting operation of the first and second auxiliary memory 135 and 136 continues, until the flip-flop circuit 153 is reset i.e. even after all the first unit block data are all read out from the memory 131, and interrupted at the time the block positioning code signal BE located at the front end of the first unit block data is detected by the code detector 139. As the time the flip-flop circuits 152 and 153 are both set, a pulse signal as shown in FIG. 12D is generated from the one-shot multivibrator 161, thereby setting both the flip-flop circuits 164 and 165 through the OR gate 163 (see FIGS. 12E and 12F). Where, therefore, a signal stored in the memory 131 is again shift controlled upon receipt of the output signal of the flip-flop circuit 164, signals stored in the first and second auxiliary memories 135 and 136 are simultaneously again shift controlled upon receipt of the output signal of the flip-flop circuit 165. Since, at this time, the specific code signal Pc is not detected by the code detector 138, the AND gate 137 is not qualified, but the AND gate 133 is qualified.

Accordingly, the block positioning code signal BE disposed at the front end of the second unit block data read out from the memory 131 is delivered to the main memory 134 through the AND gate 133 and OR gate 132, and also shifted into the first auxiliary memory 135. At this time, shifting continues in the second auxiliary memory 136 for the same length of time as in the memories 131 and 135. As a result, the block positioning code signal BE situated at the front end of the first block data is read out from the second auxiliary memory 136.

When the block positioning code signal BE at the front end of the second unit block data is fully read out from the memory 131, the specific code signal Pc is detected by the code detector 138, and also the first word signal A denoting a date which is included in the first unit block data begins to be read out from the second auxiliary memory 136 (see FIG. 2B). Since, at this time, the flip-flop circuit 165 is set, as previously described, the AND gate 167 is qualified (see FIG. 12G) and the flip-flop circuit 168 is set (see FIG. 12H). At this time, the AND gate 133 is not qualified, but the AND gate 137 is qualified. Accordingly, the first word signal A included in the first unit block data which is successively read out from the second auxiliary memory 136 instead of the specific code signal Pc read out from the memory 131 is conducted to the main memory 134 through the qualified AND gate 137 and OR gate 132, and shifted into the first auxiliary memory 135. When, at this time, the specific code signal Pc is fully read out from the memory 131, the word positioning code signal BK immediately following the specific code signal Pc is detected by the code detector 138 (see FIG. 2B). As a result, the flip-flop circuit 173 is set (see FIG. 12I) and the flip-flop circuit 164 is reset, causing shifting in the memory 131 to be temporarily stopped. On the other hand, the first word signal A included in the first unit block data is fully read out from the second auxiliary memory 136. At this time, the word positioning code signal BK following the first word signal A is detected by the code detector 139, thereby resetting the flip-flop circuit 165, and in consequence temporarily stopping shifting in the second auxiliary memory 136. Since, at this time, the flip-flop circuit 168 is also reset, shifting in the first auxiliary memory 135 is temporarily stopped.

When both flip-flop circuits 164 and 165 are reset, the one-shot multivibrator 169 generates a pulse signal as shown in FIG. 12J through the OR gate 170 to qualify the AND gate 171. Accordingly, both flip-flop circuits 164 and 165 are simultaneously set through the OR gate 163, causing shifting in the memories 131, 135 and 136 to be commenced again. Since, at this time, the specific code signal Pc is not detected by the code detector 138 (see FIG. 2B), the flip-flop circuit 168 remains reset. Thus, the AND gate 137 is not qualified, but the AND gate 133 is qualified. At this time, the second word signal B' denoting a store name which is included in the second unit block data successively read out form the memory 131 is supplied to the main memory 134 through the AND gate 133 and OR gate 132 and shifted into the first auxiliary memory 135, causing a signal already stored in the first auxiliary memory 135 to be shifted into the second auxiliary memory 136. Thus for each word signal a signal from the memory 131 and a signal from the second auxiliary memory 136 which precedes the former signal by the unit block are simultaneously read out. Where a signal from the memory 131 is the specific code signal Pc, then a word signal from the second auxiliary memory 136 is delivered to the main memory 134 and shifted back into said memory 136 through the first auxiliary memory 135. Where a signal from the memory 131 is a different word signal from the specific code signal Pc, said different word signal is conducted to the main memory 134, and the corresponding word signal stored in the second auxiliary memory 136 is replaced by the word signal read out from the memory 131 through the first auxiliary memory 135.

The last key word signal included in the unit block data, namely, the third word signal denoting a store name in this case is fully read out from the memory 131 when the key word end code signal WE is detected by the code detector 138, the flip-flop circuits 164 and 173 are reset. At this time, the flip-flop circuit 165 is also reset by the key word end code signal We detected by the code detector 139. When both flip-flop circuits 164 and 165 are reset, the one-shot multivibrator 169 again generates the aforesaid pulse signal to qualify the AND gate 172 (see FIG. 12L). As a result, the flip-flop circuits 152 and 153 are again simultaneously set through the OR gate 151, causing signals stored in the memories 131, 135 and 136 to be read out simultaneously. At this time, the flip-flop circuit 168 remains reset. In this case, the word signal stored in the main memory 131 is delivered to the main memory 134 and also shifted to the second auxiliary memory 136 through the first auxiliary memory 135.

If, as mentioned above, a plurality of mutually similar unit block data consisting of a plurality of different word information items at least some of which have the largest possible probability of bearing the same content are processed by the data processing system of this invention, then there is obtained the advantage of causing information being processed by an electronic computer to be stored in the memories 21, 83 or 131 in a very condensed form as well as of processing the subject data as quickly, efficiently and accurately as possible.

The present invention is not limited to the type arranged as described above, but is applicable to all others which have the technical concept of the invention substantially in common.

For example, according to the foregoing embodiment, the first to the third word information items included in a plurality of mutually similar unit block data each of which consists of the first to the fourth different word information items denoting a date, store name, commodity name and amount sold are used as a key word data enabling transmission in the form selectively changed into the aforesaid specific code signal Pc. However, it is possible to use any of said first to fourth word information items as a key word data. Further, the invention can be practised with the same effect, even if all the first to the fourth word data are changeable into the previously described specific code signal Pc. While, in this case, the key word end code $W_E$ is quite unnecessary, it is required to separate all word data by a word positioning code BK, directly supply a start instruction pulse signal (see FIG. 4A) to the set terminal of the flip-flop circuit 52 included in the circuitry of FIG. 3 without conducting said pulse signal through the OR gate 51, supply the reset terminal of the flip-flop circuit 62 with the block positioning code signal BE in place of the key word end code signal W_E delivered from the code detector 45, and supply the reset terminals of the flip-flop circuits 64 and 65 with a combination of the word positioning code signal BK and block positioning code signal BE instead of a combination of the aforesaid word positioning code signal BK and key word end code signal W_E sent forth from the code detectors 45 and 47. In the circuitry of FIG. 11, it is further required to supply the OR gate 166 and the reset terminal of the flip-flop circuit 173 with the block positioning code signal BE in place of the key word end code signal W_E delivered from the code detector 138 and supply the set terminal of the flip-flop circuit 152 with the start instruction signal (see FIG. 12A) without passing said signal through the OR gate 151.

According to the foregoing embodiment, where the corresponding word data included in every two adjacent unit block data have the same content or meaning, then said word data are transmitted with one of said word data changed into the far more simplified aforesaid specific code signal Pc. However, said specific code signal Pc itself can be easily omitted as shown in FIG. 2C, if the circuitries of FIGS. 3 and 11 are modified as follows. Namely, in the circuitry of FIG. 3, it is advised to omit the delay circuit 81, inverter 82, AND gate 80 and specific code generator 79. In FIG. 11, it is advised to provide three input terminals for the AND gate 167 and connect said input terminals to the Q output terminal of the flip-flop circuit 165, the output terminal of an inverter connected to said Q output terminal through a delay circuit providing a delay time equal to a length of time required to transmit a one-character signal and the detection terminal of the code detector 138 for detecting either of the aforesaid block positioning code signal BE, word positioning code signal BK and key word end code signal W_E.

What is claimed is:

1. A system for transmitting data to an output means, comprising:
    a source of a plurality of records serially arranged with record positioning codes interposed therebetween, said records including a plurality of words serially arranged with word positioning codes interposed therebetween;
    main memory means coupled to said source for temporarily storing said serially arranged records and record positioning codes;
    auxiliary memory means coupled to said main memory means for temporarily storing a record including words of different lengths read out from said main memory means based on said record and word positioning codes;
    comparator means coupled to said main and auxiliary memory means for comparing any one of the words of a record read out from said auxiliary memory means with the corresponding word of said record read out from said main memory means immediately after said record which was read out from said auxiliary memory means; and
    control circuit means coupled to said main memory means and to said comparator means for transmitting to the output means the record read out from the main memory means immediately after said record which was read out from said auxiliary memory means, in the original form, when the corresponding words are detected by said comparator means not to be identical and for transmitting the record to the output means with the corresponding word omitted when the corresponding words are detected by said comparator means to be identical.

2. The system according to claim 1 wherein a first positioning code detector is connected to the output of said memory means and to said control circuit means for detecting a record or word positioning code and for transferring the detected record or word positioning code to said control circuit means.

3. The system according to claim 1 wherein said auxiliary memory means comprises first, second and third memory means connected in series, said first memory means having a memory capacity large enough to store the longest word of the words stored in said main memory means and said second and third memory means having a memory capacity large enough to store a record from said main memory means.

4. The system according to claim 3 comprising second and third positioning code detectors connecting the outputs of said first and third memory means, respectively, to said control circuit means for detecting a record or word positioning code and for transferring the detected record or word positioning code to said control means.

5. The system according to claim 4 comprising gate control circuit means for generating different pulse signals in response to detection outputs from said first, second and third positioning code detectors, respectively; and means for shifting said main memory means and said first, second and third memory means under control of different pulse signals generated by said gate control circuit means.

6. The system according to claim 3 wherein said comparator means is a coincidence detector connected between the output of said main memory means and the output of said third memory means.

7. The system according to claim 1 wherein said control circuit means includes means for transmitting the two positioning codes on both sides of an omitted word, one immediately after the other when the corresponding words of two adjacent records are detected to be identical.

8. The system according to claim 1 wherein said control circuit means includes means for transmitting two positioning codes with a specific code interposed therebetween in place of an omitted code when the corresponding words of two adjacent records are detected to be identical.

9. The system according to claim 1 wherein said control circuit means comprises:
    a first AND circuit receiving the output of said first memory means as one gate input and the non-coincidence output of said comparator means as another gate input;
    a second AND circuit receiving the coincidence output of said comparator means as one gate input;
    specific code generating means for generating a specific code to be supplied to another gate input of said second AND circuit in place of the word of a record which is identical with the corresponding word of the immediately preceding record; and
    an OR circuit coupled to said AND circuits for causing selectively either one of said first and second AND circuits to produce an output, thereby transmitting a series of records including one or more records each with at least one word omitted.

10. A system for transmitting data to an output means, comprising:

a source of a plurality of records serially arranged with record positioning codes interposed therebetween, said records including a plurality of words serially arranged with word positioning codes interposed therebetween, the system comprising:

main memory means coupled to said source for storing a series of said serially arranged records including one or more records each with at least one word omitted when the corresponding words of any adjacent records are identical;

auxiliary memory means coupled to said main memory means for temporarily storing a record including words of different lengths read out from said main memory means based on said record and word positioning codes;

determining means coupled to said main memory means for determining that one or more words are omitted in each record read out from said main memory means; and control means for transmitting to the output means each record read out from said main memory means in the original form when no detection output is obtained from said detecting means and for inserting, when a detection output is obtained from said detecting means, a word of the record stored in said auxiliary memory means into the next record read out from said main memory means, thereby restoring said next record to the original form so that a series of records are transmitted to the output means in the original form.

11. The system according to claim 10 wherein said determining means includes means for determining that two positioning codes on both sides of an omitted word are read out from said main memory means one immediately after the other.

12. The system according to claim 10 wherein said determining means include means for determining that a specific code inserted in a record in place of an omitted word is read out from the main memory means.

13. The system according to claim 10 wherein each of the records stored in said main memory means is positioned at both ends by record positioning codes; and the respective two adjacent ones of the respective words some of which are replaced by a specific signal simplified therefrom and which constitute each of the respective records are each positioned by a word positioning code;

said determining and control means comprising:

a first code detector coupled to the output of said main memory means for detecting the record positioning code, word positioning code and specific signals;

a second code detector for detecting the record and word positioning codes;

a first AND gate having one input connected to the output of said main memory means;

an OR gate having one input connected to the output of said first AND gate and its output connected to the input of said main memory means;

first and second memory means cascade-connected to the output of said OR gate and each having a capacity sufficient to store each of the records, the output of said second memory means being coupled with said second code detector;

a second AND gate having one input connected to the output of said second memory means and its output connected to another input of said OR gate; and a gate control circuit coupled with the outputs of said first and second code detectors, with said main memory means and with said first and second memory means and being operative to deliver shift control pulse signals to the corresponding one or ones of said main memory means and said first and second memory means when at least one of the record positioning code, word positioning code and specific signals is detected by at least one of said first and second code detectors, in response to the detected record or word positioning codes or specific signals, said gate control circuit further having an output coupled via an inverter to another input of said first AND gate as well as coupled to another input of said second AND gate and operative to enable said first AND gate when the specific signal is detected by said first code detector, and to enable said second AND gate when the specific signal is not detected by said first code detector.

* * * * *